US008803280B2

(12) United States Patent
Su (10) Patent No.: US 8,803,280 B2
(45) Date of Patent: Aug. 12, 2014

(54) HIGH-VOLTAGE ESD PROTECTION DEVICE

(75) Inventor: Qing Su, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/276,242

(22) Filed: Oct. 18, 2011

(65) Prior Publication Data

US 2012/0091503 A1   Apr. 19, 2012

(30) Foreign Application Priority Data

Oct. 19, 2010   (CN) .......................... 2010 1 0511125

(51) Int. Cl.
*H01L 27/06* (2006.01)
*H01L 29/74* (2006.01)
*H01L 27/02* (2006.01)
*H01L 29/735* (2006.01)
*H02H 9/04* (2006.01)

(52) U.S. Cl.
CPC ........ *H01L 27/0262* (2013.01); *H01L 29/7436* (2013.01); *H02H 9/046* (2013.01); *H01L 29/735* (2013.01)
USPC ............ 257/500; 257/173; 257/335; 257/362

(58) Field of Classification Search
CPC ............................. H01L 27/06; H01L 23/481
USPC ......... 257/140, 173, 328, 355–363, 335, 500; 361/90–91.8
See application file for complete search history.

(56) References Cited

U.S. PATENT DOCUMENTS

| 7,109,533 | B2 * | 9/2006 | Kodama ........................ 257/173 |
| 7,436,043 | B2 * | 10/2008 | Sung et al. .................... 257/500 |
| 2002/0154463 | A1 * | 10/2002 | Mergens et al. ................ 361/56 |
| 2003/0179523 | A1 * | 9/2003 | Kodama .......................... 361/56 |

* cited by examiner

*Primary Examiner* — Matthew Landau
*Assistant Examiner* — Damon Hillman
(74) *Attorney, Agent, or Firm* — Blakely Sokoloff Taylor & Zafman (57) ABSTRACT

The present invention discloses a high-voltage ESD protection device including a silicon controlled rectifier and a first PNP transistor. The silicon controlled rectifier includes a high-voltage P-well and N-well; a first N+ and P+ diffusion region are formed in the high-voltage P-well; a second N+ and P+ diffusion region are formed in the high-voltage N-well. The first PNP transistor comprises an N-type buried layer; a low-voltage N-well formed in the N-type buried layer; and a base, emitter and collector formed in the low-voltage N-well. The base and emitter are shorted together; the collector is shorted to the second N+ diffusion region and the second P+ diffusion region; the first N+ diffusion region is shorted to the first P+ diffusion region to act as a ground terminal. The high-voltage ESD protection device can effectively adjust the ESD trigger voltage and improve the snapback sustaining voltage after the device is switched on.

8 Claims, 13 Drawing Sheets

HIGH-VOLTAGE ESD PROTECTION DEVICE

CROSS-REFERENCES TO RELATED APPLICATIONS

This application claims the priority of Chinese patent application number 201010511125.2, filed on Oct. 19, 2010, the entire contents of which are incorporated herein by reference.

TECHNICAL FIELD

The present invention relates to an ESD protection technology for semiconductor devices, especially to a high-voltage ESD protection device.

BACKGROUND OF THE INVENTION

Figure 1:
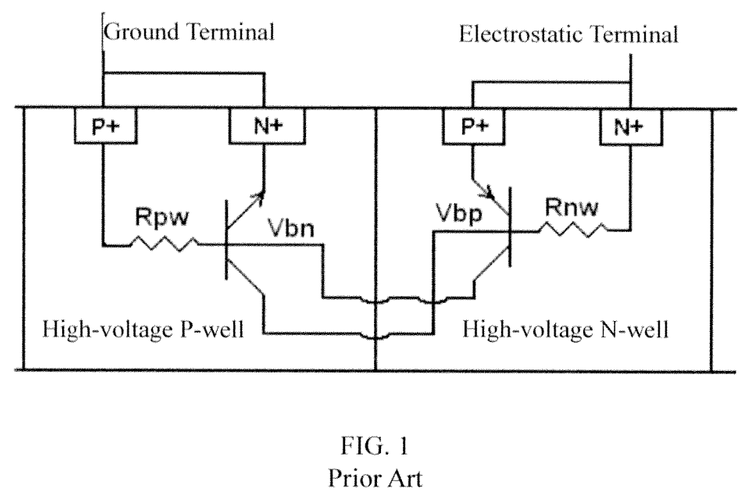
FIG. 1 shows the cross-sectional structure of an existing high-voltage silicon controlled rectifier.
Figure 2:
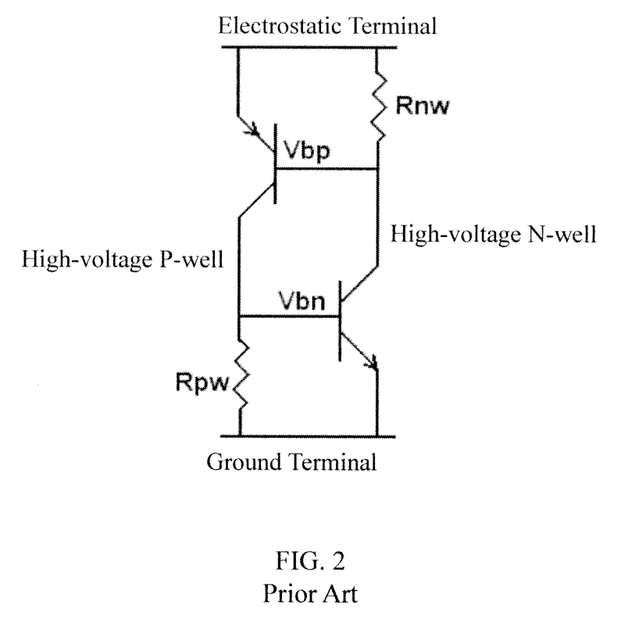
FIG. 2 shows the equivalent the high-voltage silicon controlled rectifier as shown in FIG. 1.

As an ESD protection device, a silicon controlled rectifier (SCR) has an electrostatic discharge ability higher than, generally 5~7 times higher than, that of a metal oxide semiconductor field effect transistor (MOSFET). FIG. 1 shows a schematic diagram of the cross-sectional structure of an existing high trigger voltage silicon controlled rectifier, wherein a collector of a parasitic PNP transistor composed of P+ region/high-voltage N-well/high-voltage P-well acts as a base of a parasitic NPN transistor composed of N+ region/high-voltage P-well/high-voltage N-well; similarly, a collector of the parasitic NPN transistor composed of N+ region/high-voltage P-well/high-voltage N-well also acts as a base of the parasitic PNP transistor composed of P+ region/high-voltage N-well/high-voltage P-well. FIG. 2 shows an equivalent circuit composed of the parasitic NPN and PNP transistors in FIG. 1. As shown in FIG. 1 and FIG. 2, a trigger voltage of a silicon controlled rectifier composed of the parasitic PNP transistor composed of P+ region/high-voltage N-well/high-voltage P-well and the parasitic NPN transistor composed of N+ region/high-voltage P-well/high-voltage N-well is a reverse breakdown voltage of a high-voltage N-well/high-voltage P-well junction. Generally, the reverse breakdown voltage of the high-voltage N-well/high-voltage P-well junction is high, therefore, the application of this structure is greatly limited. In addition, the parasitic NPN and PNP transistors gain positive feedbacks from each other to realize current amplification after the silicon controlled rectifier is switched on. Which leads to a low on-resistance, a large amplification and a low sustaining voltage after snapback occurs, generally from 2~5 V. A normal working voltage of a high-voltage circuit could be much higher than such a sustaining voltage, therefore, using a silicon controlled rectifier as a high-voltage ESD protection circuit is easy to cause latch-up which is hard to be recovered.

SUMMARY OF THE INVENTION

An objective of the present invention is to provide a high-voltage ESD protection device to effectively adjust the ESD trigger voltage of the high-voltage ESD protection device and improve the snapback sustaining voltage after the device is switched on.

To achieve the above objective, the present invention provides a high-voltage ESD protection device, which comprises a silicon controlled rectifier and a first PNP transistor, wherein the silicon controlled rectifier and the first PNP transistor are formed on a P-type epitaxial layer of a silicon substrate and adjacent to each other; and the silicon controlled rectifier comprises a high-voltage P-well and a high-voltage N-well adjacent to each other;

a first N+ diffusion region and a first P+ diffusion region are formed in the high-voltage P-well;

a second N+ diffusion region and a second P+ diffusion region are formed in the high-voltage N-well;

the first PNP transistor comprises an N-type buried layer; a low-voltage N-well of the first PNP transistor is formed in the N-type buried layer; a base, an emitter and a collector of the first PNP transistor are firmed in the low-voltage N-w ell of the first PNP transistor;

the base and the emitter of the first PNP transistor are shorted to each other;

the collector of the first PNP transistor is shorted to the second N+ diffusion region and the second P+ diffusion region;

the first N+ diffusion region is shorted to the first P+ diffusion region to act as a ground terminal.

The high-voltage ESD protection device can further comprise a second PNP transistor, wherein the second PNP transistor is formed on the P-type epitaxial layer of the silicon substrate and adjacent to the first PNP transistor; the second PNP transistor has the same structure with the first PNP transistor;

a base and an emitter of the second PNP transistor are shorted to each other;

a collector of the second PNP transistor is shorted to the base and emitter of the first PNP transistor.

The high-voltage ESD protection device can further comprise a PMOS transistor, wherein the PMOS transistor is formed on the P-type epitaxial layer of the silicon substrate and adjacent to the first PNP transistor;

the PMOS transistor comprises an N-type buried layer; a low-voltage N-well of the PMOS transistor is formed in the N-type buried layer of the PMOS transistor; a gate, a source and a drain of the PMOS transistor are formed in the low-voltage N-well of the PMOS transistor;

the gate, the source and the N-type buried layer of the PMOS transistor are shorted together;

the drain of the PMOS transistor is shorted to the base and the emitter of the first PNP transistor An isolation high-voltage P-w ell is formed on the P-type epitaxial layer of the silicon substrate between the silicon controlled rectifier and the first PNP transistor, and the isolation high-voltage P-well isolates the silicon controlled rectifier from the first PNP transistor.

One end of the isolation high-voltage P-well is adjacent to the high-voltage N-well of the silicon controlled rectifier and the other end of the isolation high-voltage P-well is adjacent to the N-type buried layer of the first PNP transistor to isolate the silicon controlled rectifier from the first PNP transistor.

To achieve the above objective, the present invention further provides a high-voltage ESD protection device, which comprises: a silicon controlled rectifier and a first PMOS transistor, wherein the silicon controlled rectifier and the first PMOS transistor are formed on a P-type epitaxial layer of a silicon substrate;

the silicon controlled rectifier comprises a high-voltage P-well and a high-voltage N-well adjacent to each other;

a first N+ diffusion region and a first P+ diffusion region are formed in the high-voltage P-well;

a second N+ diffusion region and a second P+ diffusion region are formed in the high-voltage N-well;

the first PMOS transistor comprises an N-type buried layer; a low-voltage N-well of the first PMOS is formed in the N-type buried layer of the first PMOS; a gate, a source and a drain of the first PMOS transistor are formed in the low-voltage N-well of the first PMOS;

the gate, the source and the N-type buried layer of the first PMOS transistor are shorted together;

the drain of the first PMOS transistor is shorted to the second N+ diffusion region and the second P+ diffusion region;

the first N+ diffusion region is shorted to the first P+ diffusion region to act as a ground terminal.

The high-voltage ESD protection device can further comprise a PNP transistor, wherein the PNP transistor is formed on the P-type epitaxial layer of the silicon substrate and adjacent to the first PMOS transistor;

the PNP transistor comprises an N-type buried layer; a low-voltage N-well of the PNP transistor is formed in the N-type buried layer of the PNP transistor; a base, an emitter and a collector of the PNP transistor are formed in the low-voltage N-well of the PNP transistor;

the base and the emitter of the PNP transistor are shorted to each other;

the collector of the PNP transistor is shorted to the gate, the source and the first N-type buried layer of the first PMOS transistor.

The high-voltage ESD protection device can further comprise a second PMOS transistor, wherein the second PMOS transistor is formed on the P-type epitaxial layer of the silicon substrate and adjacent to the first PMOS transistor; the second PMOS transistor has the same structure with the first PMOS transistor;

the gate, source and N-type buried layer of the second PMOS transistor are shorted together;

a drain of the second PMOS transistor is shorted to the gate, the source and the N-type buried layer of the first PMOS transistor.

An isolation high-voltage P-well is formed on the P-type epitaxial layer of the silicon substrate between the silicon controlled rectifier and the first PMOS transistor, the isolation high-voltage P-well isolates the silicon controlled rectifier from the first PMOS transistor.

One end of the isolation high voltage P-well is adjacent to the high-voltage N-well of the silicon controlled rectifier and the other end of the isolation high-voltage P-well is adjacent to the N-type buried layer of the first PMOS transistor to isolate the silicon controlled rectifier from the first PMOS transistor.

In the high-voltage ESD protection device of the present invention, the ESD current can be discharged through the switched-on one or more low-voltage PNP transistors or low-voltage PMOS transistors and the high-voltage silicon controlled rectifier. After the high-voltage ESD protection device of the present invention is switched on, the snapback sustaining voltage of the whole structure is determined by the sum of the snapback sustaining voltages of one or more low-voltage PNP transistors or low-voltage PMOS transistors and the high-voltage silicon controlled rectifier. As the minimum snapback sustaining voltage of the high-voltage silicon controlled rectifier is generally about 3V and that of the low-voltage PNP transistor or the low-voltage PMOS transistor is much higher, generally above 10V, therefore the whole snapback sustaining voltage of the high-voltage ESD protection device of the present invention comprising a low-voltage PNP transistor or a low-voltage PMOS transistor can reach above 10V, thus compared to a simple high-voltage silicon controlled rectifier, the snapback sustaining voltage of the high-voltage ESD protection device of the present invention is increased, reducing the risk of triggering latch-up.

BRIEF DESCRIPTION OF THE DRAWINGS

The present invention will be further described and specified in combination with the drawings and embodiments as follows.

DETAILED DESCRIPTION OF THE INVENTION

Figure 3:
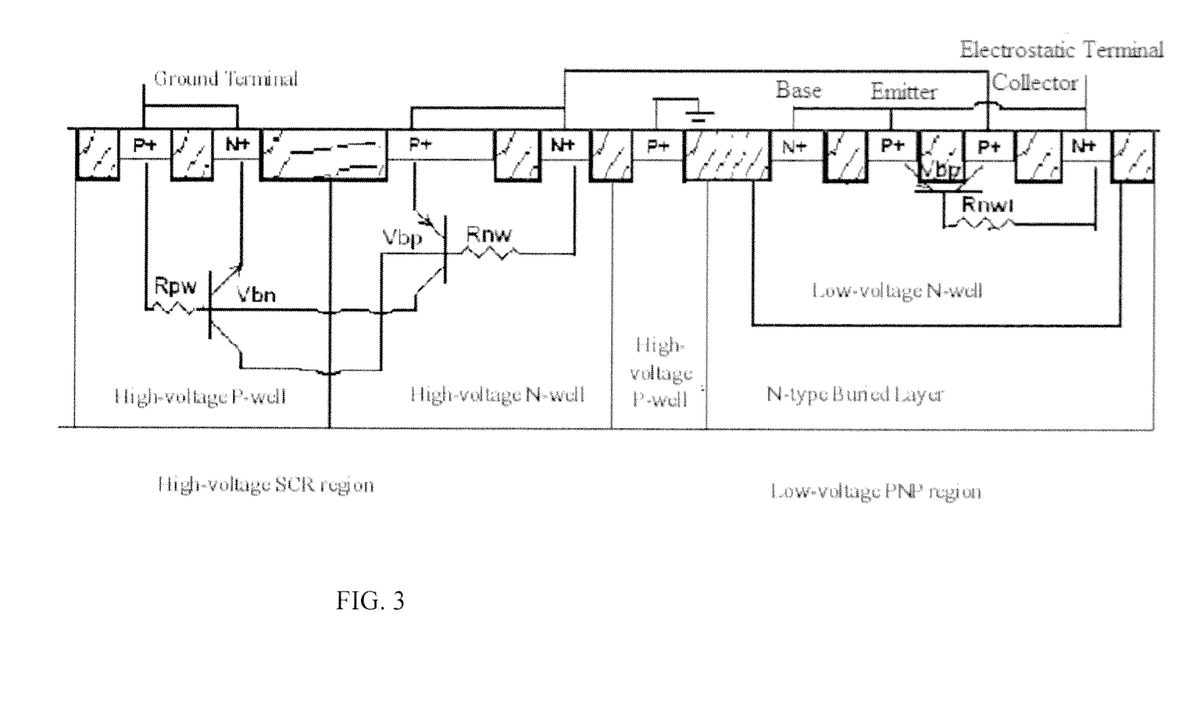
FIG. 3 shows the cross-sectional structure of the high-voltage ESD protection device in Embodiment 1 of the present invention.

FIG. 3 shows the cross-sectional structure of a high-voltage ESD protection device in Embodiment 1 of the present invention. As shown in FIG. 3, the ESD protection device comprises a silicon controlled rectifier (SCR) and a first PNP transistor, wherein:

the silicon controlled rectifier and the first PNP transistor are formed on a P-type epitaxial layer of a silicon substrate and being adjacent to each other;

an isolation high-voltage P-well is formed on the P-type epitaxial layer of the silicon substrate between the silicon controlled rectifier and the first PNP transistor, the isolation high-voltage P-well isolates the silicon controlled rectifier from the first PMOS transistor;

the silicon controlled rectifier comprises a high-voltage P-well and a high-voltage N-well; the high-voltage P-well and the high-voltage N-well are adjacent to each other;

a first N+ diffusion region and a first P+ diffusion region are formed in the high-voltage P-well;

a second N+ diffusion region and a second P+ diffusion region are formed in the high-voltage N-well;

the first PNP transistor comprises an N-type buried layer; a low-voltage N-well of the first PNP transistor is formed in the N-type buried layer; a base, an emitter and a collector of the first PNP transistor are formed in the low-voltage N-well of the first PNP transistor;

the base and the emitter of the first PNP transistor are shorted to each other to act as an electrostatic terminal;

the collector of the first PNP transistor is shorted to the second N+ diffusion region and the second P+ diffusion region;

the first N+ diffusion region is shorted to the first diffusion region to act as a ground terminal.

One end of the isolation high voltage P-well is adjacent to the high-voltage N-well of the silicon controlled rectifier and the other end of the isolation high-voltage P-well is adjacent to the N-type buried layer of the first PNP transistor to isolate the silicon controlled rectifier from the first PNP transistor.

Figure 4:
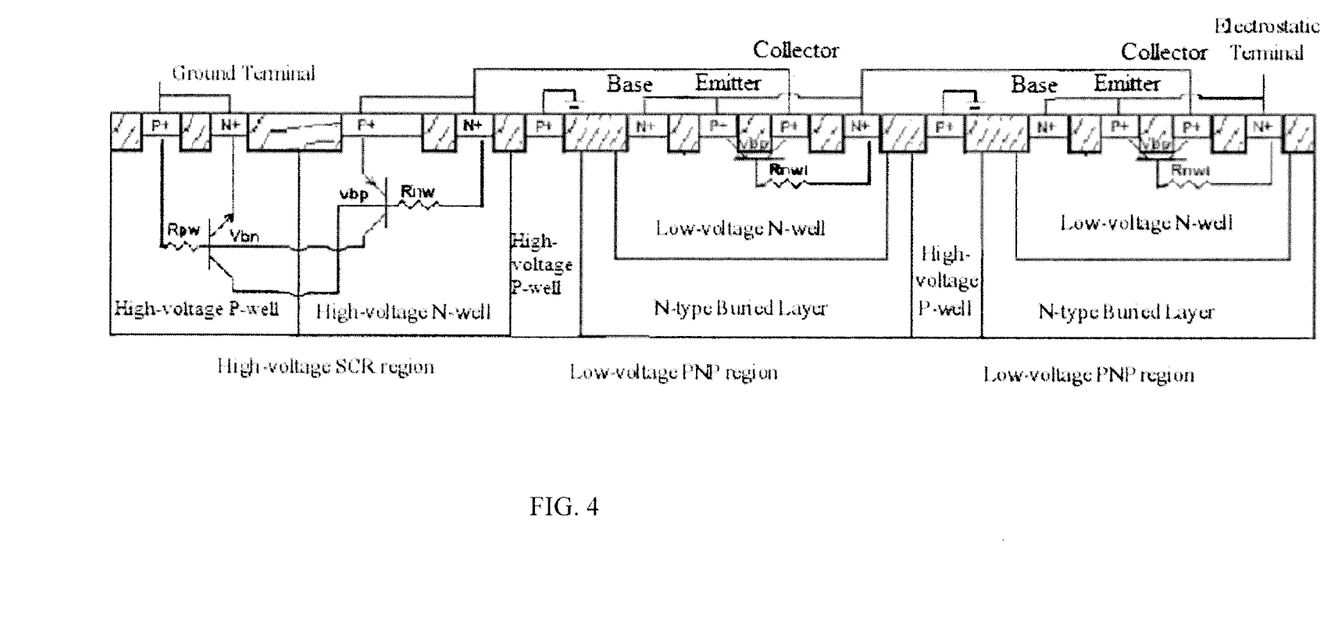
FIG. 4 shows the cross-sectional structure of the high-voltage ESD protection device in Embodiment 2 of the present invention.

FIG. 4 shows the cross-sectional structure of a high-voltage ESD protection device in Embodiment 2 of the present invention. As shown in FIG. 4, the high-voltage ESD protection device is formed by further arranging a second PNP transistor to the high-voltage ESD protection device in Embodiment 1 wherein the second PNP transistor has the same structure with the first PNP transistor; the silicon controlled rectifier, the first PNP transistor and the second PNP transistor are all formed on the P-type epitaxial layer of the silicon substrate; a base and an emitter of the second PNP transistor are shorted to each other to act as an electrostatic terminal; a collector of the second PNP transistor is shorted to the base and emitter of the first PNP transistor.

Figure 5:
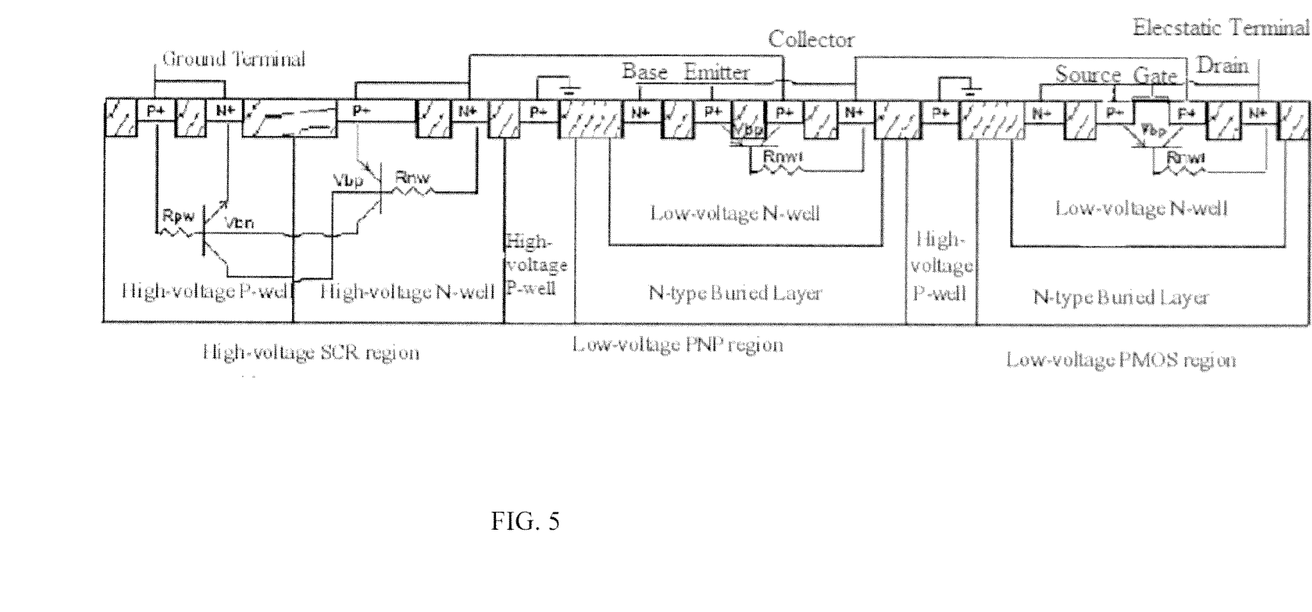
FIG. 5 shows the cross-sectional structure of the high-voltage ESD protection device in Embodiment 3 of the present invention.

FIG. 5 shows the cross-sectional structure of the high-voltage ESD protection device in Embodiment 3 of the present invention. As shown in FIG. 5, the high-voltage ESD protection device is formed by further arranging a PMOS transistor to the high-voltage ESD protection device in Embodiment 1, wherein the silicon controlled rectifier, the first PNP transistor and the PMOS transistor are all formed on the P-type epitaxial layer of the silicon substrate; the PMOS transistor comprises an N-type buried layer; a low-voltage N-well of the PMOS transistor is formed in the N-type buried layer of the PMOS transistor; a gate, a source and a drain of the PMOS transistor are formed in the low-voltage N-well of the PMOS transistor; the gate, the source and the N-type buried layer of the PMOS transistor are shorted together to act as an electrostatic terminal; the drain of the PMOS transistor is shorted to the base and the emitter of the first PNP transistor.

Figure 6:
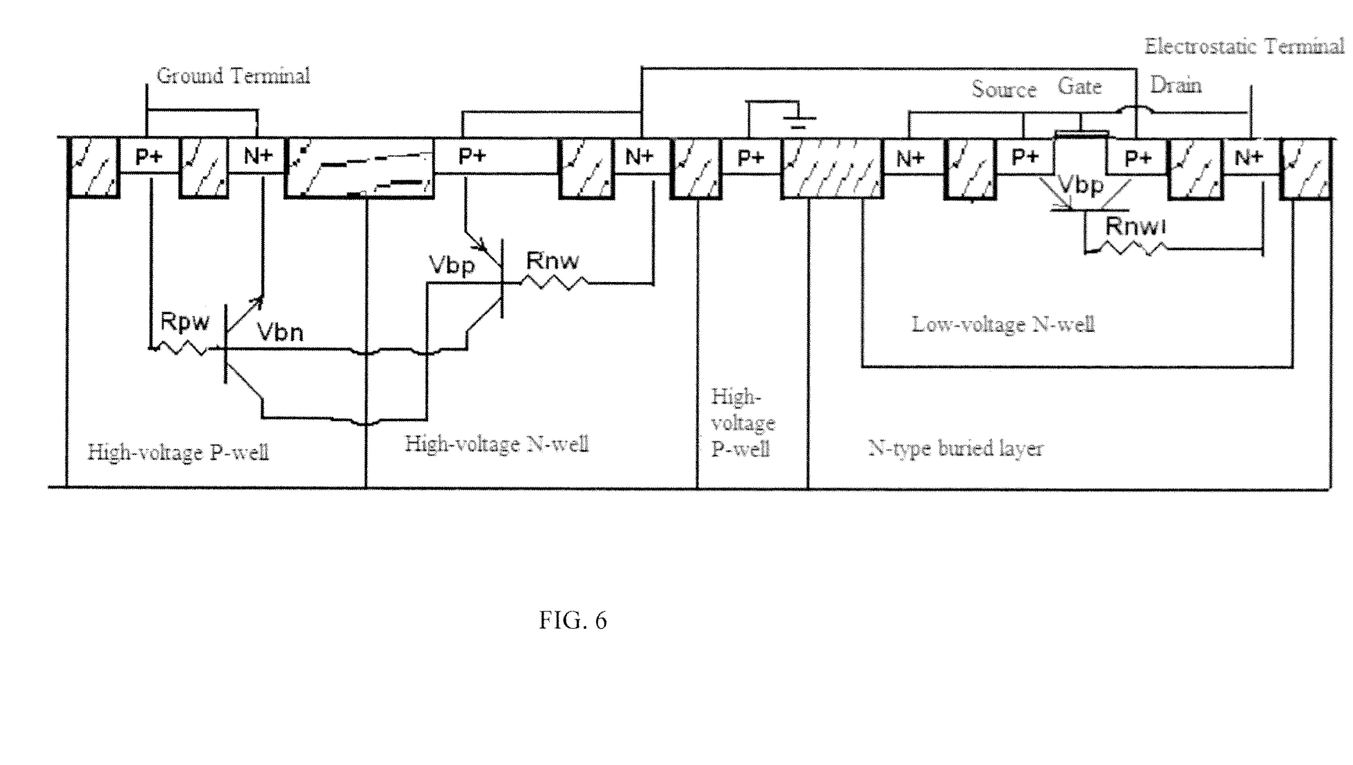
FIG. 6 shows the cross-sectional structure of the high-voltage ESD protection device in Embodiment 4 of the present invention.

FIG. 6 shows the cross-sectional structure of a high-voltage ESD protection device in Embodiment 4 of the present invention. As shown in FIG. 6, the high-voltage ESD protection device comprises a silicon controlled rectifier and a first PMOS transistor, wherein:

the silicon controlled rectifier and the first PMOS transistor are formed on a P-type epitaxial layer of a silicon substrate;

an isolation high-voltage P-well is formed on the P-type epitaxial layer of the silicon substrate between the silicon controlled rectifier and the first PMOS transistor and the isolation high-voltage P-well isolates the silicon controlled rectifier from the first PMOS transistor;

the silicon controlled rectifier comprises a high-voltage P-well and a high-voltage N-well; the high-voltage P-well and the high-voltage N-well are adjacent to each other;

a first N+ diffusion region and a first P+ diffusion region are formed in the high-voltage P-well;

a second N+ diffusion region and a second P+ diffusion region are formed in the high-voltage N-well;

the first PMOS transistor comprises an N-type buried layer; a low-voltage N-well of the first PMOS is formed in the N-type buried layer of the first PMOS; a gate, a source and a drain of the first PMOS transistor are formed in the low-voltage N-well of the first PMOS;

the gate, the source and the N-type buried layer of the first PMOS transistor are shorted together to act as an electrostatic terminal;

the drain of the first PMOS transistor is shorted to the second N+ diffusion region and the second P+ diffusion region;

the first N+ diffusion region is shorted to the first P+ diffusion region to act as a ground terminal.

One end of the isolation high-voltage P-well is adjacent to the high-voltage N-well of the silicon controlled rectifier and the other end of the isolation high-voltage P-well is adjacent to the N-type buried layer of the first PMOS transistor to isolate the silicon controlled rectifier from the first PMOS transistor.

Figure 7:
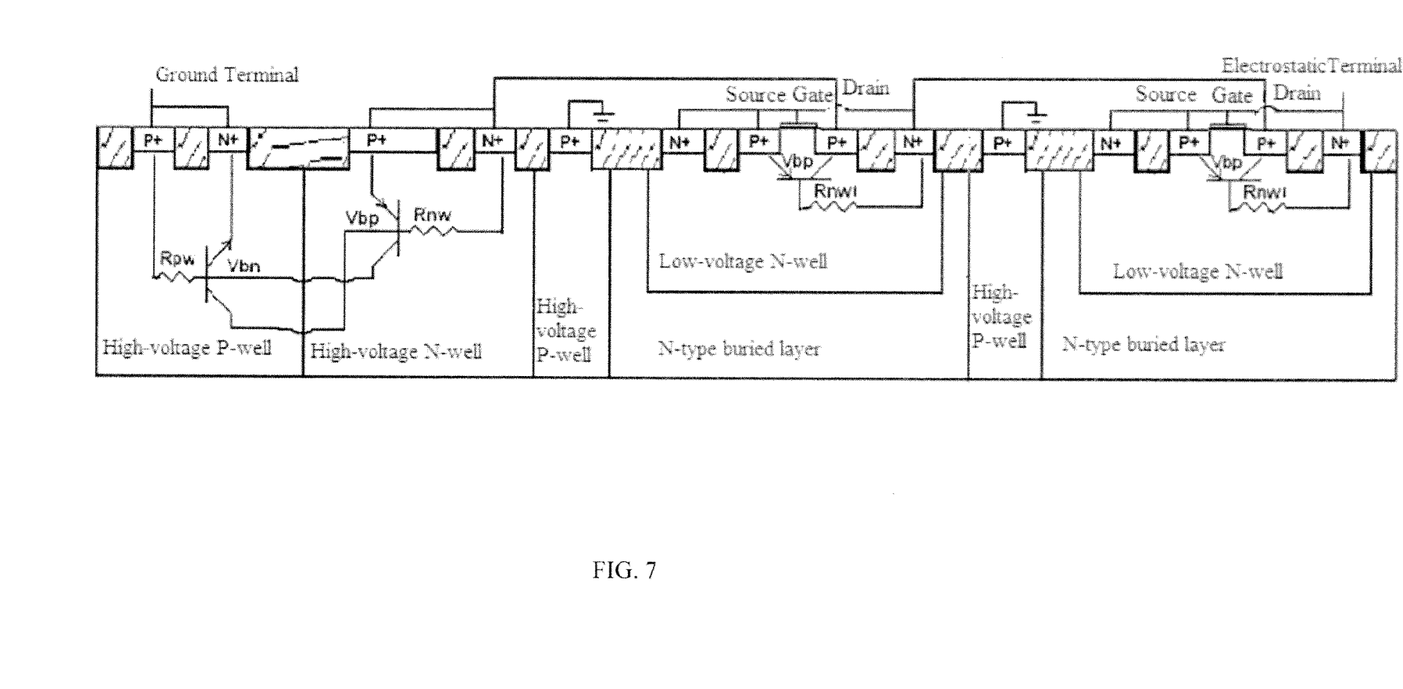
FIG. 7 shows the cross-sectional structure of the high-voltage ESD protection device in Embodiment 5 of the present invention.

FIG. 7 shows the cross-sectional structure of a high-voltage ESD protection device in Embodiment 5 of the present invention. As shown in FIG. 7, the high-voltage ESD protection device is formed by further arranging a second PMOS transistor to the high-voltage ESD protection device in Embodiment 4, wherein the second PMOS transistor has the same structure with the first PMOS transistor; the silicon controlled rectifier, the first PMOS transistor and the second PMOS transistor are all formed on the P-type epitaxial layer of the silicon substrate; a gate, a source and an N-type buried layer of the second PMOS transistor are shorted together to act as an electrostatic terminal; a drain of the second PMOS transistor is shorted to the gate, the source and the N-type buried layer of the first PMOS transistor.

Figure 8:
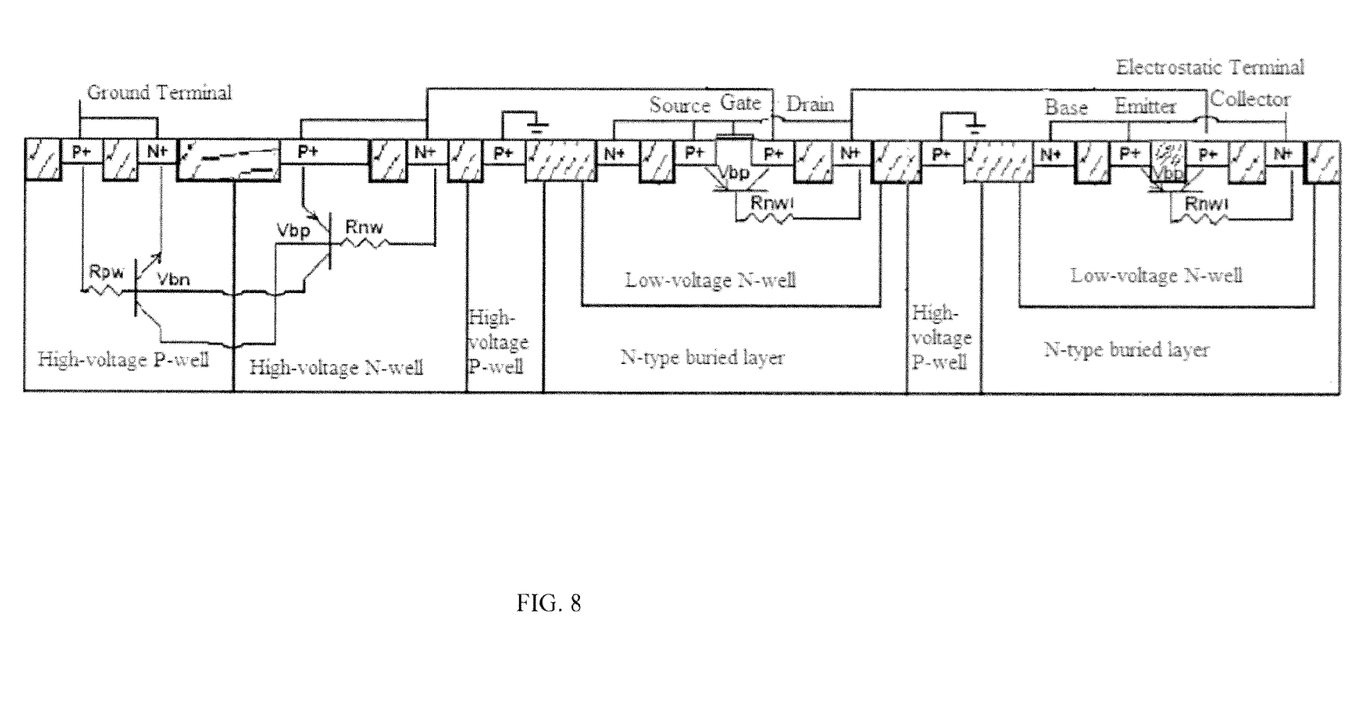
FIG. 8 shows the cross-sectional structure of the high-voltage ESD protection device in Embodiment 6 of the present invention.

FIG. 8 shows the cross-sectional structure of a high-voltage ESD protection device in Embodiment 6 of the present invention. As shown in FIG. 8, the high-voltage ESD protection device is formed by further arranging a second PNP transistor to the high-voltage ESD protection device in Embodiment 5, wherein the silicon controlled rectifier, the first PMOS transistor and the second PNP transistor are all formed on the P-type epitaxial layer of the silicon substrate; the second PNP transistor comprises an N-type buried layer; a low-voltage N-well of the second PNP transistor is formed in the N-type buried layer of the second PNP transistor; a base, an emitter and a collector of the second PNP transistor are formed in the low-voltage N-well of the second PNP transistor; the base and the emitter of the second PNP transistor are shorted to each other to act as an electrostatic terminal; the collector of the second PNP transistor is shorted to the gate, the source and the N-type buried layer of the first PMOS transistor.

The high-voltage ESD protection device of the present invention is composed of a high-voltage silicon controlled rectifier and a low-voltage PNP transistor or a PMOS transistor, wherein the high-voltage silicon controlled rectifier and the low-voltage PNP transistor or PMOS transistor are isolated from each other by a high-voltage P-well. High voltage may occurs in a low-voltage N-well of the low-voltage PNP transistor or PMOS transistor, and the breakdown voltage between the low-voltage N-well and the P-type epitaxial layer is low, therefore the low-voltage PNP transistor or PMOS transistor is disposed in an N-type buried layer. As the low-voltage N-well is surrounded by the N-type buried layer, and the low-voltage N-well and the N-type buried layer are of the same type, therefore they will get a same potential when in use; however as the N-type buried layer is lightly and deeply doped, compared to the low-voltage N-well, the breakdown voltage between the N-type buried layer and the P-type epitaxial layer is deeper, therefore the breakdown voltage between the low-voltage N-well and the P-type epitaxial layer is high and the junction between the low-voltage N-well and the P-type epitaxial layer are hard to be broken down.

Figure 9:
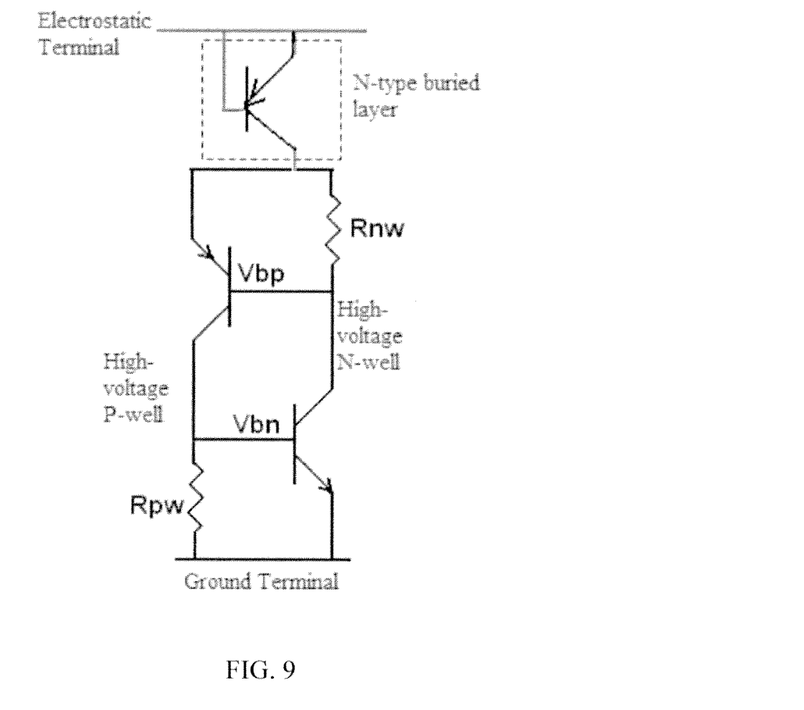
FIG. 9 shows the equivalent circuit of the high-voltage ESD protection device in Embodiment 1 of the present invention.
Figure 10:
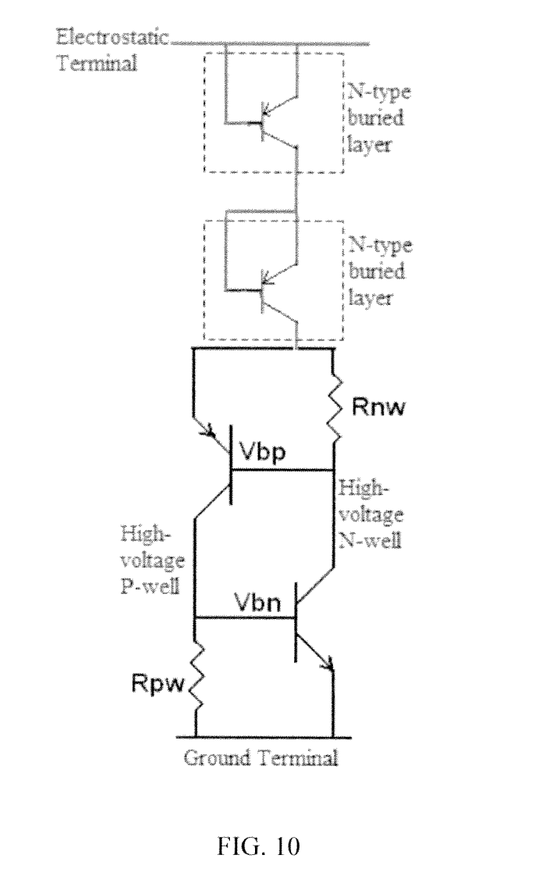
FIG. 10 shows the equivalent circuit of the high-voltage ESD protection device in Embodiment 2 of the present invention.
Figure 11:
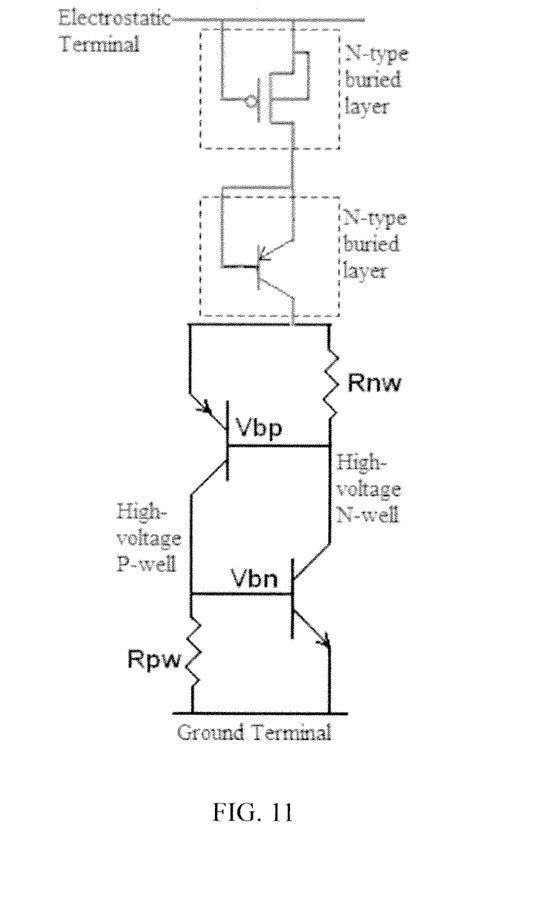
FIG. 11 shows the equivalent circuit of the high-voltage ESD protection device in Embodiment 3 of the present invention.
Figure 12:
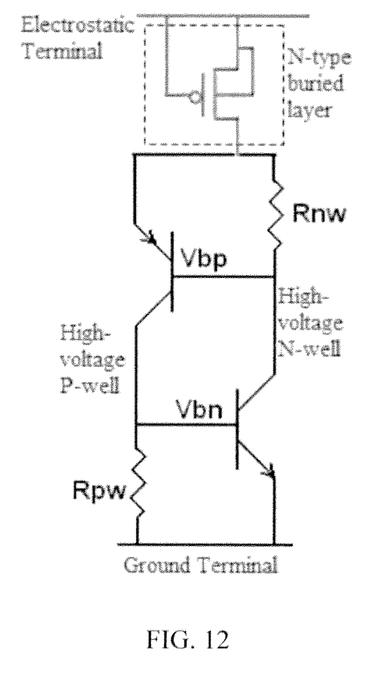
FIG. 12 shows the equivalent circuit of the high-voltage ESD protection device in Embodiment 4 of the present invention.
Figure 13:
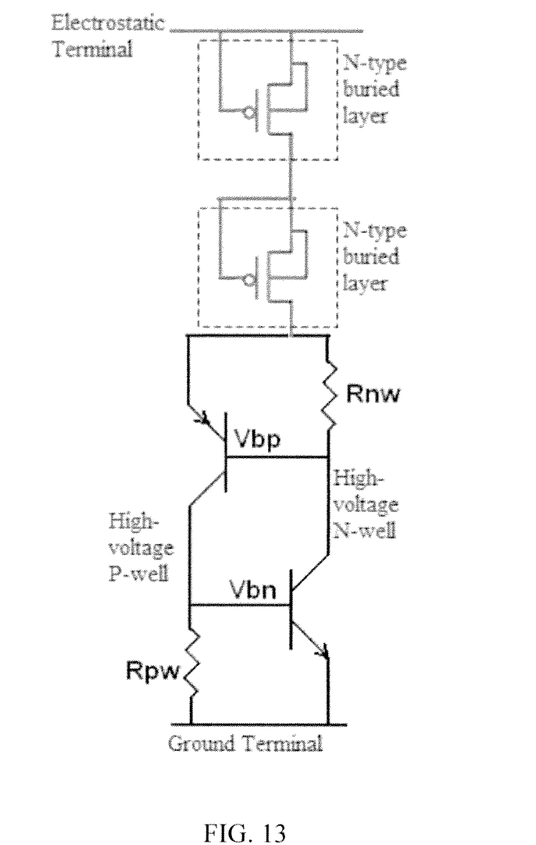
FIG. 13 shows the equivalent circuit of the high-voltage ESD protection device in Embodiment 5 of the present invention.
Figure 14:
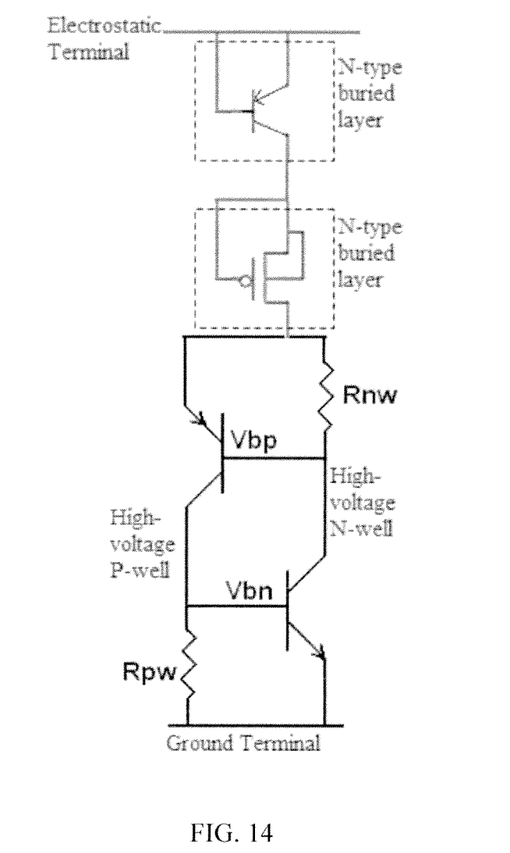
FIG. 14 shows the equivalent circuit of the high-voltage ESD protection device in Embodiment 6 of the present invention.

For the high-voltage ESD protection device of the present invention, the equivalent circuit of Embodiment 1 is shown in FIG. 9; the equivalent circuit of Embodiment 2 is shown in FIG. 10; the equivalent circuit of Embodiment 3 is shown in FIG. 11; the equivalent circuit of Embodiment 4 is shown in FIG. 12; the equivalent circuit of Embodiment 5 is shown in FIG. 13; and the equivalent circuit of Embodiment 6 is shown in FIG. 14.

Although the above embodiments only provide embodiments with two-stage low-voltage PNP transistors or PMOS transistors, according to the needs for adjusting the trigger voltage of a high-voltage ESD protection device, more than two-stage low-voltage PNP transistors or PMOS transistors can be used.

When static electricity current flows into the base and the emitter of a low-voltage PNP transistor, or from the gate and the source of a low-voltage PMOS transistor, and flows out from a ground terminal of a silicon controlled rectifier, the high-voltage silicon controlled rectifier and the low-voltage PNP transistor or the parasitic PNP transistor of the low-voltage PMOS transistor should be switched on to dissipate the current. The low-voltage PNP transistor or the low-voltage PMOS transistor should be first switched on and the junction between the low-voltage N-well and the P+ diffusion region of the collector of the low-voltage PNP transistor or the junction between the low-voltage N-well and the P+ diffusion region of the drain of the low-voltage PMOS transistor will be broken down to trigger the low-voltage PNP transistor or the parasitic PNP transistor of the low-voltage PMOS transistor to enter a current forward amplification state. For the high-voltage silicon controlled rectifier, the junction between the high-voltage N-well and the high-voltage P-well is needed to be broken down to trigger the parasitic PNP transistor composed of the second P+ diffusion region/the high-voltage N-well/the high-voltage P-well and parasitic NPN transistor composed of the high-voltage N-well/the high-voltage P-well/the first N+ diffusion region, making the high-voltage silicon controlled rectifier enter a positive feedback current amplification state to dissipate current. Therefore, the trigger voltage of the whole high-voltage ESD protection device of the present invention is determined by the sum of the switch-on voltages of the low-voltage PNP transistor or the low-voltage PMOS transistor in each stage and the high-voltage silicon controlled rectifier, so that the trigger voltage of the high-voltage ESD protection device can be flexibly adjusted by multi-stage switch-on voltages.

In the high-voltage ESD protection device of the present invention, electrostatic discharge current can be dissipated by switching on the low-voltage PNP transistor or the low-voltage. PMOS transistor in each stage and the high-voltage silicon controlled rectifier. The snapback sustaining voltage of the whole structure after the high-voltage ESD protection device of the present invention is switched on is determined by the sum of the snapback sustaining voltages of the low-voltage PNP transistors or low-voltage PMOS transistors and the high-voltage silicon controlled rectifier. As the minimum snapback sustaining voltage of the high-voltage silicon controlled rectifier is generally about 3V and the minimum snapback sustaining voltages of the low-voltage PNP transistors or the low-voltage PMOS transistors are much higher, generally above 10V, the snapback sustaining voltage of the whole high-voltage ESD protection device of the present invention comprising a one-stage low-voltage PNP transistor or low-voltage PMOS transistor can reach above 10V, thus compared to a simple high-voltage silicon controlled rectifier, the snapback sustaining voltage of the high-voltage ESD protection device of the present invention is increased, reducing the risk of triggering latch-up.

The high-voltage ESD protection device of the present invention can be applied in BCD process and effectively and flexibly adjust the ESD trigger voltage, further improve the snapback sustaining voltage after the device is switched on and effectively prevent the occurrence of a transient latch-up effect.

What is claimed is:

1. A high-voltage ESD protection device, comprising a silicon controlled rectifier, a first PNP transistor and an isolation high-voltage P-well for isolating the silicon controlled rectifier from the first PNP transistor, wherein:
   the silicon controlled rectifier and the first PNP transistor are formed on a P-type epitaxial layer of a silicon substrate;
   the silicon controlled rectifier comprises a high-voltage P-well and a high-voltage N-well adjacent to each other;
   a first N+ diffusion region and a first P+ diffusion region are formed in the high-voltage P-well;
   a second N+ diffusion region and a second P+ diffusion region are formed in the high-voltage N-well;
   the first PNP transistor comprises an N-type buried layer and a low-voltage N-well formed in the N-type buried layer of the first PNP transistor;
   a third N+ diffusion region, a third P+ diffusion region, and a fourth P+ diffusion region are formed in the low-voltage N-well of the first PNP transistor to serve as a base, an emitter and a collector of the first PNP transistor, respectively;
   the base and the emitter of the first PNP transistor are shorted to each other and connected to an electrostatic terminal;
   the collector of the first PNP transistor is shorted to the second N+ diffusion region and the second P+ diffusion region;
   the first N+ diffusion region is shorted to the first P+ diffusion region to act as a ground terminal for dissipating an electrostatic discharge between the electrostatic terminal and the ground terminal.

2. The high-voltage ESD protection device according to claim 1, further comprising a second PNP transistor, wherein:
   the second PNP transistor is formed on the P-type epitaxial aver of the silicon substrate and is adjacent to the first PNP transistor;
   the second PNP transistor has a same structure with the first PNP transistor;
   the base and the emitter of the first PNP transistor are connected to the electrostatic terminal through the second PNP transistor, wherein:
   a base and an emitter of the second PNP transistor are shorted to each other and connected to the electrostatic terminal;
   a collector of the second PNP transistor is shorted to the base and the emitter of the first PNP transistor.

3. The high-voltage ESD protection device according to claim 1, further comprising a PMOS transistor, wherein:

the PMOS transistor is formed on the P-type epitaxial layer of the silicon substrate and is adjacent to the first PNP transistor;

the PMOS transistor comprises an N-type buried layer and a low-voltage N-well formed in the N-type buried layer of the PMOS transistor;

a gate of the PMOS transistor is formed on a surface of the low-voltage N-well;

a fifth P+ diffusion region and a sixth P+ diffusion region are formed in the low-voltage N-well of the PMOS transistor to serve as a source and a drain of the PMOS transistor, respectively;

the base and the emitter of the first PNP transistor are connected to the electrostatic terminal through the PMOS transistor, wherein:

the gate, the source and the N-type buried layer of the PMOS transistor are shorted together and connected to the electrostatic terminal;

the drain of the PMOS transistor is shorted to the base and the emitter of the first PNP transistor.

4. The high-voltage ESD protection device according to claim 1, wherein one end of the isolation high-voltage P-well is adjacent to the high-voltage N-well of the silicon controlled rectifier and the other end of the isolation high-voltage P-well is adjacent to the N-type buried layer of the first PNP transistor to isolate the silicon controlled rectifier from the first PNP transistor.

5. A high-voltage ESD protection device, comprising a silicon controlled rectifier, a first PMOS transistor and an isolation high-voltage P-well for isolating the silicon controlled rectifier from the first PMOS transistor, wherein:

the silicon controlled rectifier and the first PMOS transistor are formed on a P-type epitaxial layer of a silicon substrate;

the silicon controlled rectifier comprises a high-voltage P-well and a high-voltage N-well adjacent to each other;

a first N+ diffusion region and a first P+ diffusion region are formed in the high-voltage P-well;

a second N+ diffusion region and a second P+ diffusion region are formed in the high-voltage N-well;

the first PMOS transistor comprises an N-type buried layer and a low-voltage N-well formed in the N-type buried layer of the first PMOS;

a gate of the first PMOS transistor is formed on a surface of the low-voltage N-well;

a third P+ diffusion region and a fourth P+ diffusion region are formed in the low-voltage N-well of the first PMOS to serve as a source and a drain of the first PMOS transistor, respectively;

the gate, the source and the N-type buried layer of the first PMOS transistor are shorted together and connected to an electrostatic terminal;

the drain of the first PMOS transistor is shorted to the second N+ diffusion region and the second P+ diffusion region;

the first N+ diffusion region is shorted to the first P+ diffusion region to act as a ground terminal for dissipating an electrostatic discharge between the electrostatic terminal and the ground terminal.

6. The high-voltage ESD protection device according to claim 5, further comprising a PNP transistor, wherein:

the PNP transistor is formed on the P-type epitaxial layer of the silicon substrate and is adjacent to the first PMOS transistor;

the PNP transistor comprises an N-type buried layer and a low-voltage N-well formed in the N-type buried layer of the PNP transistor;

a third N+ diffusion region, a fifth P+ diffusion region and a sixth P+ diffusion region are formed in the low-voltage N-well of the PNP transistor to serve as a base, an emitter and a collector of the PNP transistor, respectively;

the gate, the source and the N-type buried layer of the first PMOS transistor are connected to the electrostatic terminal through the PNP transistor, wherein:

the base and the emitter of the PNP transistor are shorted to each other and connected to the electrostatic terminal;

the collector of the PNP transistor is shorted to the gate, the source and the first N-type buried layer of the first PMOS transistor.

7. The high-voltage ESD protection device according to claim 5, further comprising a second PMOS transistor, wherein:

the second PMOS transistor is formed on the P-type epitaxial layer of the silicon substrate and is adjacent to the first PMOS transistor;

the second PMOS transistor has a same structure with the first PMOS transistor;

the gate, the source and the N-type buried layer of the first PMOS transistor are connected to the electrostatic terminal through the second PMOS transistor, wherein:

a gate, a source and an N-type buried layer of the second PMOS transistor are shorted together and connected to the electrostatic terminal;

a drain of the second PMOS transistor is shorted to the gate, the source and the N-type buried layer of the first PMOS transistor.

8. The high-voltage ESD protection device according to claim 5, wherein one end of the isolation high-voltage P-well is adjacent to the high-voltage N-well of the silicon controlled rectifier and the other end of the isolation high-voltage P-well is adjacent to the N-type buried layer of the first PMOS transistor to isolate the silicon controlled rectifier from the first PMOS transistor.

* * * * *

UNITED STATES PATENT AND TRADEMARK OFFICE
CERTIFICATE OF CORRECTION

| | | |
|---|---|---|
| PATENT NO. | : 8,803,280 B2 | Page 1 of 1 |
| APPLICATION NO. | : 13/276242 | |
| DATED | : August 12, 2014 | |
| INVENTOR(S) | : Qing Su | |

It is certified that error appears in the above-identified patent and that said Letters Patent is hereby corrected as shown below:

In the Claims

Column 8, Claim 2, line 54, delete "aver" and insert --layer--.

Signed and Sealed this
Seventeenth Day of February, 2015

Michelle K. Lee
*Deputy Director of the United States Patent and Trademark Office*